United States Patent
Chang et al.

(10) Patent No.: US 7,522,023 B2
(45) Date of Patent: Apr. 21, 2009

(54) GYRATOR WITH FEEDBACK RESISTORS

(75) Inventors: Te-Chih Chang, Hsin-Chu (TW); Fang-Lih Lin, Taipei (TW)

(73) Assignee: AMIC Communication Corporation, Hsin-Chu (TW)

( * ) Notice: Subject to any disclaimer, the term of this patent is extended or adjusted under 35 U.S.C. 154(b) by 0 days.

(21) Appl. No.: 10/908,436

(22) Filed: May 11, 2005

(65) Prior Publication Data

US 2006/0197632 A1      Sep. 7, 2006

(30) Foreign Application Priority Data

Mar. 1, 2005    (TW) ............................... 94106103 A

(51) Int. Cl.
*H03H 11/00*    (2006.01)
(52) U.S. Cl. ................. 333/215; 333/214; 331/117 FE; 331/167
(58) Field of Classification Search .................. 333/215, 333/214; 331/117 FE, 167
See application file for complete search history.

(56) References Cited

U.S. PATENT DOCUMENTS 6,404,308 B1 *   6/2002   Mattisson ................... 333/215
6,490,706 B2    12/2002   Mattisson

* cited by examiner

*Primary Examiner*—Benny Lee
*Assistant Examiner*—Kimberly E Glenn
(74) *Attorney, Agent, or Firm*—Winston Hsu

(57) ABSTRACT

A gyrator includes a gyrator core and at least one common mode feedback circuit. The gyrator core includes four inverters mutually connected in a loop configuration between a pair of input ends and a pair of output ends. The common mode feedback circuit is provided between the pair of input ends and/or the pair of output ends and includes a forward-reverse connection inverter set and a backward-reverse connection inverter set. The forward-reverse connection inverter set has a first inverter, a second inverter connected in reverse series with the first inverter, and a first feedback resistor connected in parallel with the second inverter. The backward-reverse connection inverter set has a third inverter, a fourth inverter connected in reverse series with the third inverter, and a second feedback resistor connected in parallel with the fourth inverter.

7 Claims, 8 Drawing Sheets

GYRATOR WITH FEEDBACK RESISTORS

BACKGROUND OF INVENTION

1. Field of the Invention

The present invention relates to a gyrator, and more particularly, to a gyrator with feedback resistors.

2. Description of the Prior Art

Gyrators are one of many kinds of electronic circuits for converting impedance. For example, a gyrator has the capability to make an inductance circuit behave like a capacitance circuit. In the design of a continuous time filter, an integrator or a gyrator is frequently used for converting impedance. In fact, two integrators can be electrically connected in a loop to form a gyrator.

Please refer to FIG. 1 and FIG. 2. FIG. 1 is a circuit diagram of a Nauta cell gyrator NCG having a gyrator core GCi disclosed in U.S. Pat. No. 6,490,706. FIG. 2 is an equivalent circuit diagram of the gyrator NCG. In the design of a filter of the prior art, at least a filter section FSTi comprises the gyrator NCG. In FIG. 2, a relation between an input current I1 and an output voltage V2 is I1=−gm*V2, and another relation between an input voltage V1 and an output current is I2=gm*V1, where −gm is a negative trans-conductance of the gyrator NCG and gm is a positive trans-conductance.

In addition to the gyrator core GCi, the gyrator NCG shown in FIG. 1 further comprises two common mode feedback sections CMIi and CMOi. The gyrator core GCi comprises four inverters GI1$i$, GI2$i$, GI3$i$, and GI4$i$ electrically connected between two input ends i_1 and i_2 and two output ends o_1 and o_2. The common mode feedback section CMIi comprises two non-reverse series connection inverter sets, each of which comprises an inverter CMI1 and a short-circuited inverter CMI2. The common mode feedback section CMOi also comprises two non-reverse series connection inverter sets, each of which comprises an inverter CMO1 and a short-circuited inverter CMO2.

Please refer to FIG. 3, which is an equivalent circuit diagram of an inverter (such as the inverter CMI1, or the inverter CMO1) of the gyrator NCG shown in FIG. 1. The inverter has an admittance matrix equal to $$Y_{inv} = \begin{bmatrix} y_i + y_f & -y_f \\ y_m - y_f & y_o + y_f \end{bmatrix}, \quad \text{(eq. 1)}$$

where $y_i = sc_i$ is an input admittance, $y_o = g_o + sc_o$ is an output admittance, $y_f = sc_f$ is a trans-admittance from an output end to an input end, and ym is a trans-admittance from the input end to the output end.

Based on eq.1, an admittance matrix of the gyrator core GCi can be derived as $$Y_{core} = \begin{bmatrix} y_l + y_f & -y_f & 0 & y_m - y_f \\ y_m - y_f & y_l + y_f & -y_f & 0 \\ 0 & y_m - y_f & y_l + y_f & -y_f \\ -y_f & 0 & y_m - y_f & y_l + y_f \end{bmatrix}$$

(without losing the generality, the gyrator NCG is assumed to comprise identical inverters GI1$i$, GI2$i$, GI3$i$, GI4$i$, CMI1, CMI2, CMO1, and CMO2), and an admittance matrix of the common mode feedback section can be derived as $$Y_{CM} = \begin{bmatrix} 2y_l + y_m & 0 & y_m - 2y_f & 0 \\ 0 & 2y_l + y_m & 0 & y_m - 2y_f \\ y_m - 2y_f & 0 & 2y_l + y_m & 0 \\ 0 & y_m - 2y_f & 0 & 2y_l + y_m \end{bmatrix},$$

where yi is equal to $y_i+y_f+y_o$. Accordingly, an admittance matrix of the gyrator NCG can be derived as $$Y_{gyr} = \begin{bmatrix} 3y_l + y_m + y_f & -y_f & y_m - 2y_f & y_m - y_f \\ y_m - y_f & 3y_l + y_m + y_f & -y_f & y_m - 2y_f \\ y_m - 2y_f & y_m - y_f & 3y_l + y_m + y_f & -y_f \\ -y_f & y_m - 2y_f & y_m - y_f & 3y_l + y_m + y_f \end{bmatrix}. \quad \text{(eq. 2)}$$

Under an assumption that the applied signal of the gyrator NCG is differential, that is $V_{i1}=-V_{i2}$, $V_{o1}=-V_{o2}$, $I_{i1}=-I_{i2}$, and $I_{o1}=-I_{o2}$, where $V_{i1}, V_{i2}, V_{o1}$ and $V_{o2}$ are four voltages on two input ends i_1 and i_2 and two output ends o_1 and o_2 respectively, and $I_{i1}, I_{i2}, I_{o1}, I_{o2}$ four currents flowing through the input ends i_1 and i_2 and the output ends o_1 and o_2 respectively, eq.2 can be simplified as $$Y_{gyr} = \begin{bmatrix} 3(y_i + 2y_f + y_o) + \Delta y_m & -y_m \\ y_m & 3(y_i + 2y_f + y_o) + \Delta y_m \end{bmatrix}. \quad \text{(eq. 3)}$$

If YI is defined to be equal to $3(y_i+2y_f+y_o)$, eq.3 can be further simplified as $$Y_{gyr} = \begin{bmatrix} Y_l + \Delta y_m & -y_m \\ y_m & Y_l + \Delta y_m \end{bmatrix}, \quad \text{(eq. 4)}$$

where $\Delta ym$ is a difference between trans-admittances ym.

In U.S. Pat. No. 6,490,706, a channel delay effect is taken into consideration, that is $y_m=g_m e^{-S\tau}$, and $\tau=c_m/g_m$, where $\tau$ is an effective channel delay of the gyrator core GCi, $g_m$ is an effective gyrating constant, and cm is an effective trans-capacitance. The gyrator NCG has to function in a stable condition: g*c is not smaller than gm*cm, where g is an effective conductive loading of the gyrator GCi, and c is an effective capacitive loading.

However, the above stable condition is applied to a specific case only.

Moreover, since an integrator of the gyrator NCG has a DC gain equal to A0=gm/g, and g is proportional to I/L, and gm is proportional to I/Vod, where I is a bias current of the inverter, L is a channel length, and $V_{od}$ is an overdrive voltage, if gm is kept constant, A0 can be increased through a decrease in I, or another increase in L so as to decrease g. However, in the meantime of the decreasing 1, Vod is decreased accordingly. Therefore, the gyrator has a poor linearity. On the other hand, cm is increased as L is increased, and the stability of the gyrator NCG will be reduced further.

SUMMARY OF INVENTION

It is therefore a primary objective of the claimed invention to provide a gyrator with a feedback resistor, so as to solve the problems of deteriorating linearity and decreasing stability resulting from the efforts to increase DC gain.

According to the claimed invention, the gyrator includes a gyrator core and at least a common mode feedback section. The gyrator core includes four inverters mutually connected in a loop configuration between a pair of input ends and a pair of output ends. The common mode feedback section is electrically connected between the pair of the input ends or the pair of the output ends. The common mode feedback section includes a forward-reverse series connection inverter set and a backward-reverse series connection inverter set electrically connected in anti-parallel with the forward-reverse series connection inverter set. The forward-reverse series connection inverter set includes a first inverter, a second inverter electrically connected in reverse series with the first inverter, and a first feedback resistor electrically connected in parallel with the second inverter. The backward-reverse series connection inverter set includes a third inverter, a fourth inverter electrically connected in reverse series with the third inverter, and a second feedback resistor electrically connected in parallel with the fourth inverter.

Taking a channel delay effect into consideration, the gyrator has a stable condition $|y_{LE}^2(jw_0)|>g_m^2$, where $w_0$ is an existing smallest positive number making $2w_0\tau+\angle y_{LE}^2(jw_0)=\pi$, $Y_{LE}^2(s)$ is an effective loading product of the gyrator core, $\tau$ is an effective channel delay, and $g_m$ is an effective gyrating constant.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
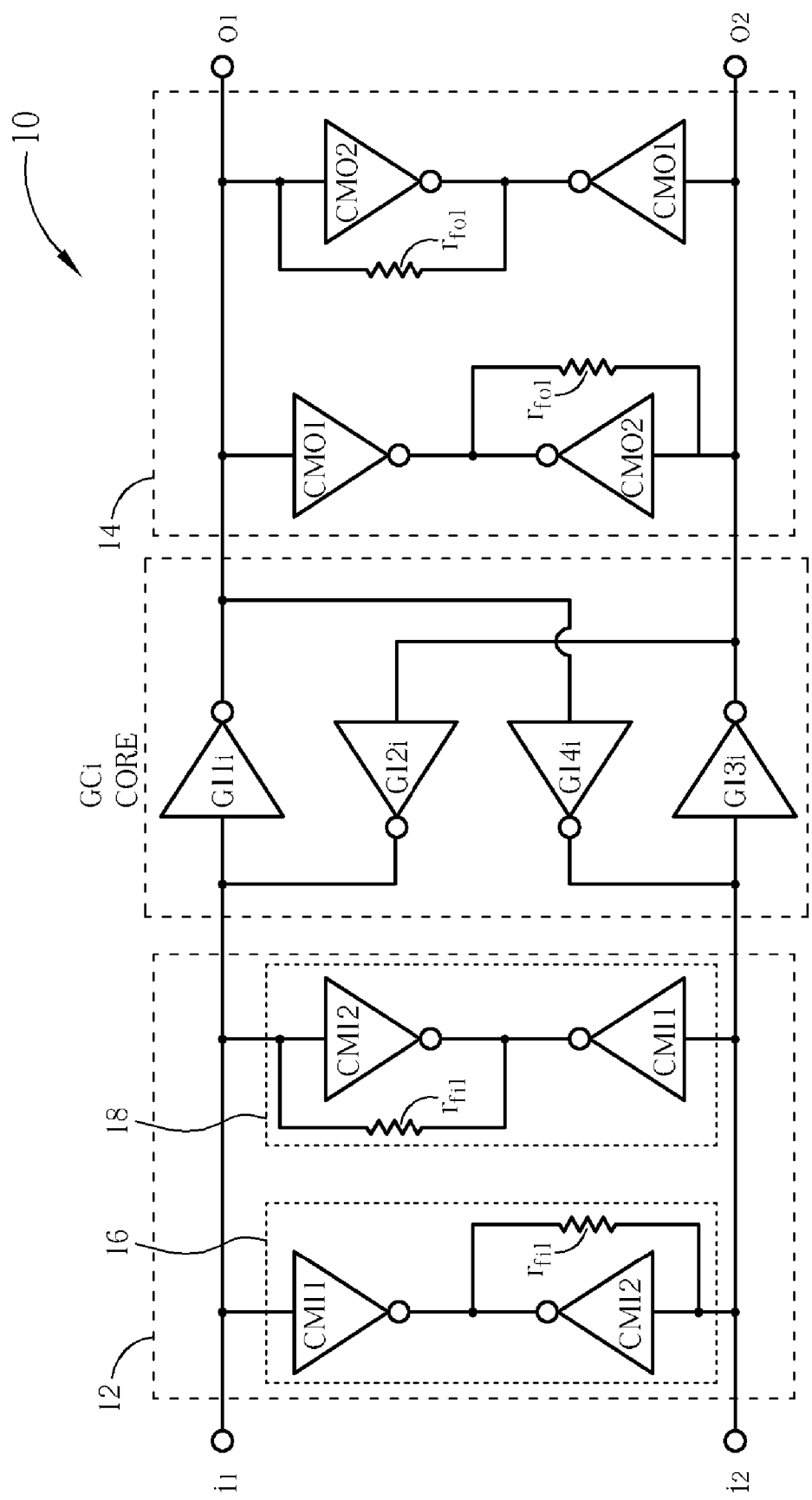
FIG. 4 is a circuit diagram of a gyrator of the preferred embodiment according to the present invention.

Please refer to FIG. 4, which is a circuit diagram of a gyrator 10 having a gyrator core GCi of the preferred embodiment according to the present invention. In addition to the gyrator core GCi, the gyrator 10 further comprises an input common mode feedback section 12, and an output common mode feedback section 14

Figure 1:
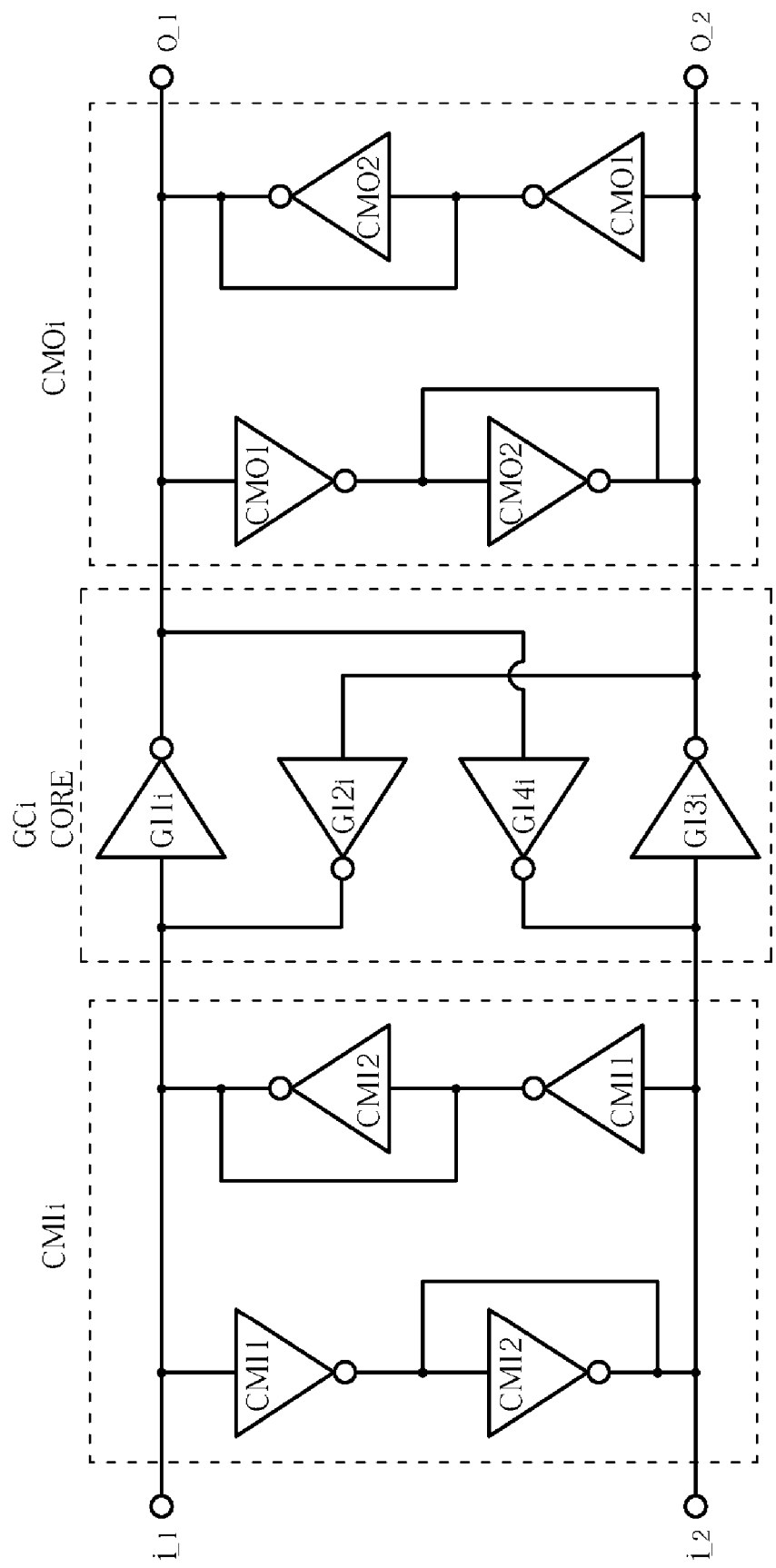
FIG. 1 is a circuit diagram of a gyrator according to the prior art.
Figure 2:
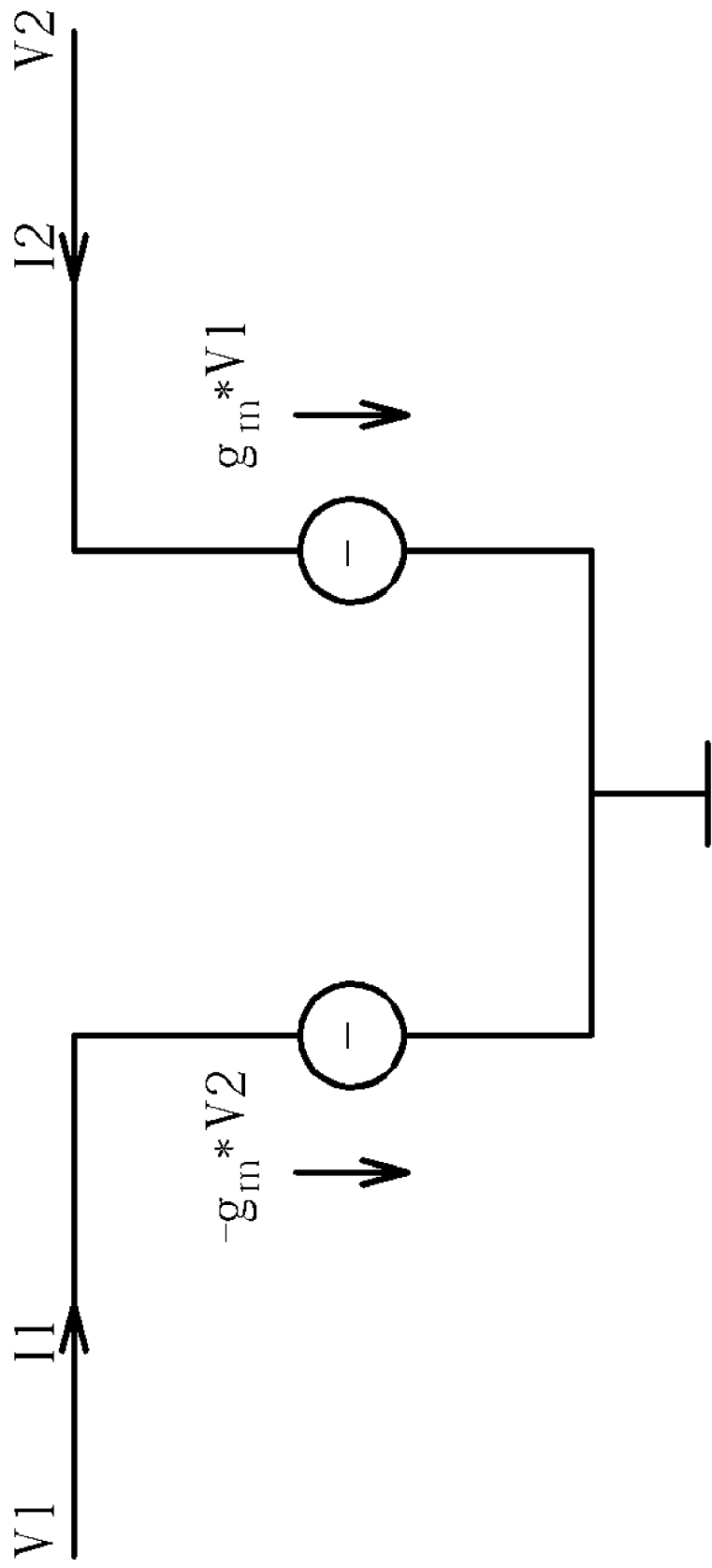
FIG. 2 is an equivalent circuit diagram of the gyrator shown in FIG. 1.
Figure 3:
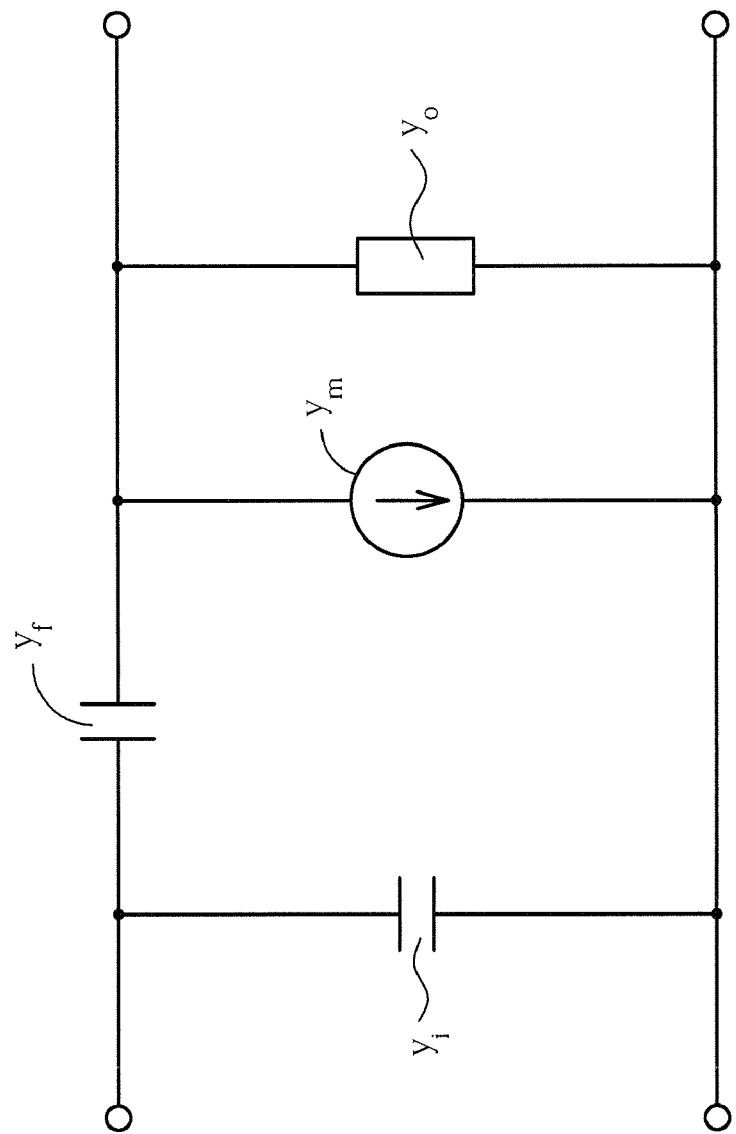
FIG. 3 is an equivalent circuit diagram of an inverter of the gyrator shown in FIG. 1.

Different from the common mode feedback section CMIi of the gyrator NCG shown in FIG. 1, which comprises two non-reverse series connection inverter sets, the input common mode feedback section 12 comprises two reverse series connection inverter sets, a forward-reverse series connection inverter set 16 and a backward-reverse series connection inverter set 18, each of which comprises an inverter CMI1, an inverter CMI2, and an input feedback resister $r_{fi1}$ electrically connected in parallel with the inverter CMI2. Similarly, the output common mode feedback section 14 comprises two reverse series connection inverter sets, each of which comprises an inverter CMO1, an inverter CMO2, and an output feedback resister $r_{fo1}$ electrically connected in parallel with the inverter CMO2.

According to the preferred embodiment, any one of the inverters of the gyrator 10 can comprise a transistor, and the transistor can be a MOS, a COMS, or a bi-polar transistor.

The gyrator 10 has a larger DC gain $A_0$ due to the installation of the feedback resistor $r_{fi1}(r_{fo1})$, and this is described as follows.

Figure 5:
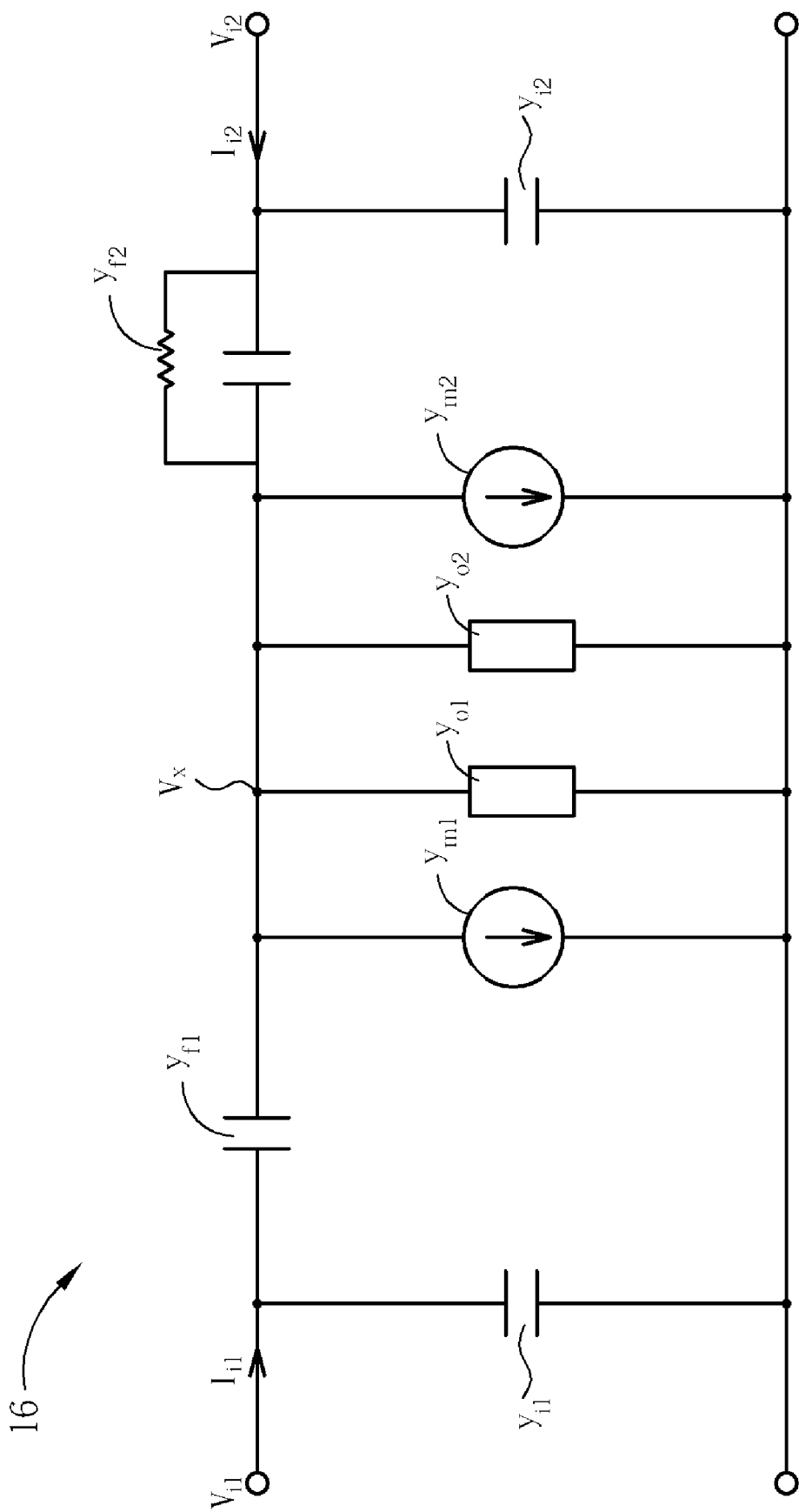
FIG. 5 is an equivalent circuit diagram of a forward-reverse series connection inverter set of an input common mode feedback section of the gyrator shown in FIG. 4.

Please refer to FIG. 5, which is an equivalent circuit diagram of the forward-reverse connection inverter set 16 (the backward-reverse connection inverter set 18 is similar) of the input common mode feedback section 12 (the output common mode feedback section 14 is similar) of the gyrator 10 shown in FIG. 4. In FIG. 5, current flowing into an intermediate point $V_x$ is equal to current flowing out from the intermediate point $V_x$, that is yf1(Vi1−Vx)+yf2(Vi2−Vx)=ym1 Vi1+ym2Vi2+(yo1+y02)Vx (eq.5). Eq.5 can be derived as $$-V_x = \left(\frac{y_{m1}-y_{f1}}{y_x}\right)V_{i1} + \left(\frac{y_{m2}-y_{f2}}{y_x}\right)V_{i2}, \qquad (eq.\ 6)$$

where yx=yo1+yo2+yf1+yf2. Based on eq.6, a relation between $I_{i1}$, $I_{i2}$, $V_{i1}$, and $V_{i2}$ can be derived as:

$$\begin{aligned} I_{i1} &= y_{i1}V_{i1} + y_{f1}(V_{i1}-V_x) \\ &= \left(y_{i1} + y_{f1} + y_{f1}\frac{y_{m1}-y_{f1}}{y_x}\right)V_{i1} + y_{f1}\frac{y_{m2}-y_{f2}}{y_x}V_{i2} \end{aligned} \qquad (eq.\ 7)$$

and $$\begin{aligned} I_{i2} &= y_{i2}V_{i2} + y_{f2}(V_{i2}-V_x) \\ &= y_{f2}\frac{y_{m1}-y_{f1}}{y_x}V_{i1} + \left(y_{i2} + y_{f2} + y_{f2}\frac{y_{m2}-y_{f2}}{y_x}\right)V_{i2} \end{aligned} \qquad (eq.\ 8)$$

Eq.7 and eq.8 can be combined to form $$\begin{bmatrix} I_{i1} \\ I_{i2} \end{bmatrix} = \begin{bmatrix} y_{i1} + y_{f1} + y_{f1}\frac{y_{m1} - y_{f1}}{y_x} & y_{f1}\frac{y_{m2} - y_{f2}}{y_x} \\ y_{f2}\frac{y_{m1} - y_{f1}}{y_x} & y_{i2} + y_{f2} + y_{f2}\frac{y_{m2} - y_{f2}}{y_x} \end{bmatrix} \quad \text{(eq. 9)}$$

$$\begin{bmatrix} V_{i1} \\ V_{i2} \end{bmatrix}$$

$$= \begin{bmatrix} y_{11} & y_{12} \\ y_{21} & y_{22} \end{bmatrix} \begin{bmatrix} V_{i1} \\ V_{i2} \end{bmatrix}$$

Without losing the generality, all of the inverters of the gyrator 10 are assumed to be identical and have a feedback resistance of $r_f = 1/g_f$, that is $y_{i1} = y_{i2} = y_i$, $y_{o1} = y_{o2} = y_o$, $y_{f1} = y_f$, $y_{f2} = y_f + g_f$, and $y_{m1} = y_{m2} = y_m$. Therefore, an admittance matrix of the input common mode feedback section 12 can be derived as $$Y_{CM} = \begin{bmatrix} y_{11} + y_{22} & 0 & y_{12} + y_{21} & 0 \\ 0 & y_{11} + y_{22} & 0 & y_{12} + y_{21} \\ y_{12} + y_{21} & 0 & y_{11} + y_{22} & 0 \\ 0 & y_{12} + y_{21} & 0 & y_{11} + y_{22} \end{bmatrix}.$$

Similarly, assume differential signal is applied to the gyrator 10. Therefore, the admittance matrix can be simplified as $$Y_{gyr} = \begin{bmatrix} Y_L & -y_m \\ y_m & Y_L \end{bmatrix}, \quad \text{(eq. 10)}$$

where $Y_L = (y_{11} + y_{22}) - (y_{12} + y_{21}) + (y_i + 2y_f + y_o)$, and $$Y_L = 3y_i + 4y_f + y_0 + \frac{g_f(2y_o + 2y_f)}{2y_o + 2y_f + g_f}$$

Figure 6:
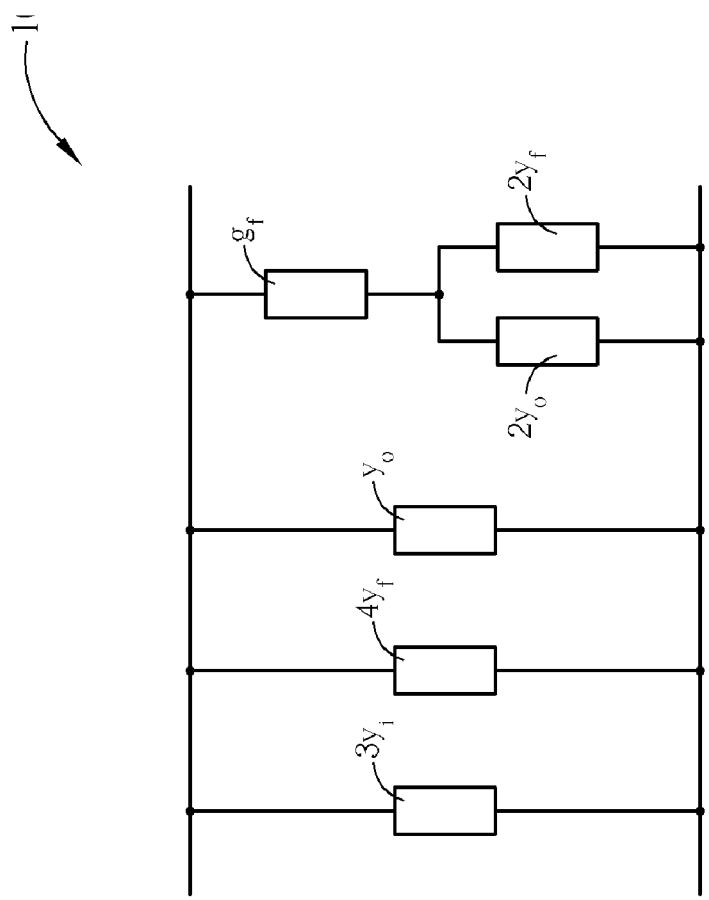
FIG. 6 and FIG. 7 are two equivalent circuit diagrams of an input loading admittance or an output loading admittance of the gyrator shown in FIG. 4.

In accordance with eq.10, an equivalent circuit diagram of $Y_L$ is shown in FIG. 6. It is apparent that the installation of the feedback resistor $r_{fi1}$ ($r_{fo1}$) increases the impedance of $Y_L$, and the gyrator 10 has therefore a higher DC gain $A_0$.

The stable condition of gyrator 10 is derived as follows. Under an assumption that differential signal is applied to the gyrator 10, the admittance matrix Ygyr of the gyrator 10 can be represented as $$Y_{gyr} = \begin{bmatrix} y_{LI} & -y_{mO} \\ y_{mI} & y_{LO} \end{bmatrix},$$

where $y_{LI}$ is an input loading admittance, $y_{LO}$ is an output loading admittance, $y_{mI}$ is a trans-admittance from an input end to an output end, and $y_{mO}$ is another trans-admittance from the output end to the input end. The channel delay effect is taken into consideration, that is $y_{mI} y_{mO} = g_m^2 e^{-2S\tau}$, where $\tau$ is an effective channel delay of the gyrator core GCi, and $g_m$ is an effective gyrating constant. Accordingly, the characteristic function of gyrator 10 can be derived as $$\Delta(s) = 1 + \frac{y_{mI}y_{mO}}{y_{LI}y_{LO}} = 1 + \frac{g_m^2 e^{-2s\tau}}{y_{LE}^2(s)} = 1 + F_d(s) = 1 + F(s)e^{-2S\tau}, \quad \text{(eq. 11)}$$

where $Y_{LE}^2(s)$ is an effective loading product of the gyrator core GCi, $F_d(s)$ is a loop transfer function, and $F(s)$ is another loop transfer function without taking the channel delay effect into consideration. The stable condition of the gyrator 10 is sustained if all of zeros of $\Delta(s)$ are located in the left half region of the S-plane. Whether or not a zero of $\Delta(s)$ is located in the left half region of the S-plane can be determined through an application of a Nyquist plot.

Figure 7:
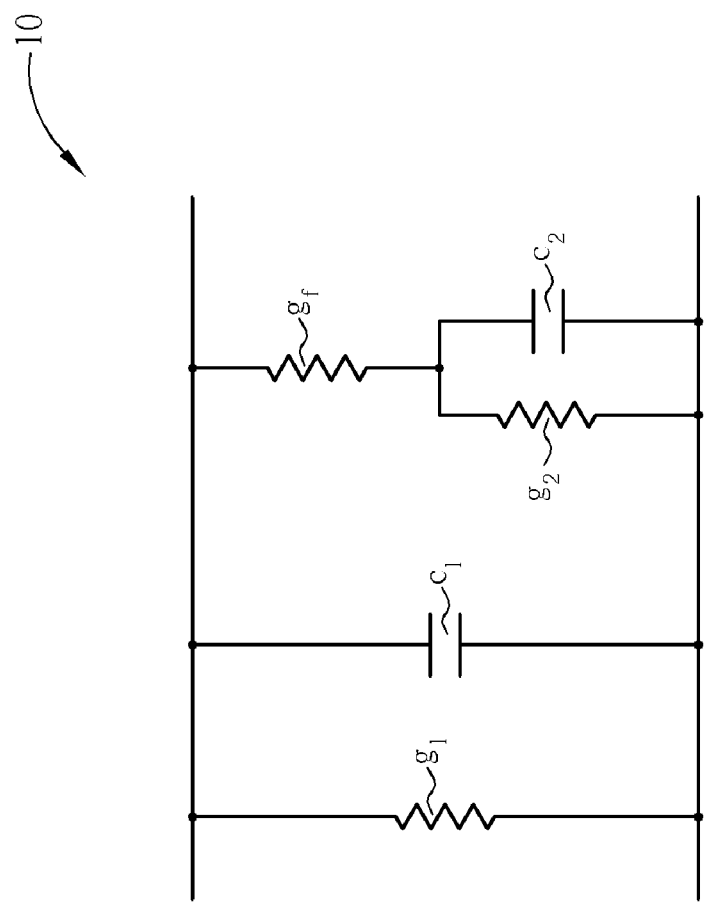
Figure 8:
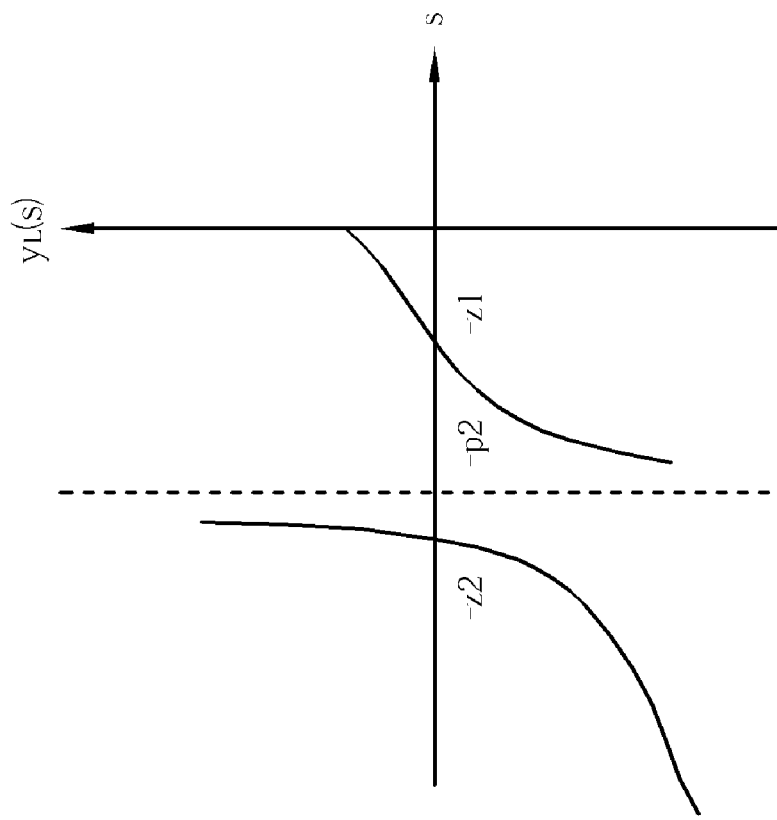
FIG. 8 is a plot diagram of zeros and poles of the input loading admittance or the output loading admittance shown in FIG. 7.

It can be seen from eq.10 that $Y_L$ is a network comprising nothing but resistors and capacitors, so $Y_L$ can be further simplified as $$Yl(s) = g_1 + sc_1 + \frac{g_f(g_2 + sc_2)}{g_f + (g_2 + sc_2)}, \quad \text{(eq. 12)}$$

where $g_1 = g_o$, $g_2 = 2g_o$, $c_2 = 2c_f + 2c_o$, and $c_1 = 3c_i + 4c_f + c_o + c_{ext}$, where $c_{ext}$ is an external capacitance of the gyrator 10. Please refer to FIG. 7, which is an equivalent circuit diagram of the simplified $Y_L$. Eq.12 can be rewritten as $$Yl(s) = (g_f + g_1 + sc_1) - \frac{g_f^2}{g_f + g_2 + sc_2} = \frac{c_1(s+z_1)(s+z_2)}{(s+p_2)}, \quad \text{(eq. 13)}$$

where $-p_2 = -(gf+g2)/c2 < 0$ is a pole of yL(s), and $-z_1$ and $-z_2$ are two zeros. A curve yL(s) shown in FIG. 8 is obtained if s in eq.13 changes along a negative real axis ($s=0 \rightarrow -\infty$), wherein when $s=0$, $yL(s)>0$, when $s=-p_2^+$, $yL(s) \rightarrow -\infty$, when $s=-p_2^-$, $yL(s) \rightarrow \infty$, and when $s \rightarrow -\infty$, $yL(s) \rightarrow -\infty$. Because yL(s) is a continuous function besides the pole-$p_2$, the two zeros $-z_1$ and $-z_2$ are easily determined to be two negative real numbers with the pole $-p_2$ located between the two zeros $-z_1$ and $-z_2$. Without losing the generality, the pole $-p_2$ and the two zeros $-z_1$ and $-z_2$ are assumed to be located in an order of $z_2 > p_2 > z_1$.

Therefore, it is concluded that:

1. Neither $F_d(s)$ nor $F(s)$ has any pole or zero located in the right half region of the S-plane;
2. when $s \rightarrow \infty$, $F_d(s) \rightarrow 0$; and
3. $F_d(-jw) = F_d(jw)^*$.

Hence, whether or not the gyrator is stable now can be determined through observing whether the Nyquist plot of $F_d(s)$ when $s=j\infty \rightarrow j0$ encircles a specific point $(-1, j0)$.

When s changes along a positive imaginary axis ($s=j0 \rightarrow j\infty$), each of $|(s+z1)/(s+p2)|$ and $|(s+z2)|$ is a monotonic increasing function, so when $w=0-\infty$, $|Y_L(jw)|$ is also a monotonic increasing function, while $|F_d(jw)|=|F(jw)|$ is a monotonic decreasing function. Moreover, a deduction of $\angle yL(s) = \angle(s+z_1) + \angle(s+z_2) - \angle(s+p_2)$ can obtain $\angle Y_L(jw) \geq \angle(jw+z_2) \geq 0$ and $\angle Y_L(jw) < \angle(jw+z_1) < \pi/2$, so $-\pi < \angle F(jw) \geq 0$. Since a phase delay $-2w\tau$ due to the channel delay effect is also a monotonic decreasing function, $\angle F_d(jw) \geq 0$.

In summary, the stable condition of the gyrator 10 can be represented through the introduction of a concept of gain margin, that is $|F_d(jw_0)|<1$, where $w_0$ is an existing smallest positive real number making $\angle F_d(jw_0)=-\pi$ or $|y_{LE}^2(jw_0)|>g_m^2$, where $w_0$ is a smallest positive real number making $2w_0\tau+\angle y_{LE}^2(jw_0)=\pi$.

However, the solution to this is not easy to obtain. Since $|F_d(jw)|$ is a monotonic decreasing function when $w=0\to\infty$, if a positive real number $w_0$ makes $|F_d(jw_0)|=1$ and $\angle F_d(jw)$ is restricted to be within a specific function larger than $-\pi$ when $w\geq w_0$, the system is stable. In short, through the introduction of a bounding function and the concept of a phase margin, a sufficient condition for stability can be obtained.

For example, assume $y_p(s)$ has the following characteristics: when $w=0\to\infty$, if $\angle y_p(jw)$ is a monotonic increasing function and $\angle y_p(jw)\geq\angle y_L(jw)$, $y_p(s)$ is a phase upper bound function of $y_L(s)$. Based on the above, if a positive real number $w_0$ makes $|F_d(jw_0)|=1$ and $2w_0\tau+\angle y_{PI}(jw_0)+\angle y_{PO}(jw_0)<\pi$, where $y_{PI}(s)$ and $y_{PO}(s)$ are two phase upper bound functions of $y_{LI}(s)$ and $y_{LO}(s)$ respectively, $0\geq\angle F_d(jw)>-\pi$ when $w\geq w_0$, and the system is determined to be stable.

Similarly, assume $y_A(s)$ has the following characteristics: when $w=0\to\infty$, if $|y_A(jw)|$ is a monotonic increasing function and $|y_A(jw)|\geq|y_L(jw)|$, $y_A(s)$ is an amplitude lower bound function of $y_L(s)$. Based on the above, if a positive real number $w_0$ makes $|y_{AI}(jw_0)|*|y_{AO}(jw_0)|=g_m^2$ and $2w_0\tau+\angle y_{PI}(jw_0)+\angle y_{PO}(jw_0)<\pi$, where $y_{AI}(s)$ and $y_{AO}(s)$ are two amplitude lower bound functions of $y_{LI}(s)$ and $y_{LO}(s)$ respectively, when $w>w_0|F_d(jw)|<1$ and when $w\leq w_0 0\geq\angle F_d(jw)>-\pi$, and the system is determined to be stable.

Inspecting eq.12 again, $$yl(jw) = g_1 + j\omega c_1 + \frac{g_f(g_2+j\omega c_2)}{g_f+(g_2+j\omega c_2)} = \quad (eq.\ 14)$$

$$g_1 + g_3 + \frac{g_f^2}{g_f+g_2}*\frac{k}{1+k} + j\omega\left[c_1+c_3\left(1-\frac{k}{1+k}\right)\right]$$

is obtained, where $k=(wc_2)^2/(g_f+g_2)^2>0$, $g_3=(g_fg_2)/(g_f+g_2)$, and $c_3=c_2(g_f/(g_f+g_2))^2$.

It can be seen from eq.14 that $y_{P1}(s)=(g_1+g_3)+s(c_1+c_3)$ is a phase upper bound function of $y_L(s)$. Naturally, $y_{P2}(s)=(g_1+g_3)+s(c_1+c_2)$ is also a phase upper bound function of $y_L(s)$. On the other hand, $y_{A1}(s)=(g_1+g_3)+sc_1$ is an amplitude lower bound function of $y_L(s)$. Naturally, $y_{A2}(s)=g_1+sc_1$ and $y_{A3}(s)=sc_1$ are another amplitude lower bound functions of $y_L(s)$. Through the use of the above bounding functions, a stable condition can be obtained.

For example, when all of the inverters of the gyrator 10 are identical and all the feedback resistors are also identical, the above $y_{A3}(s)$ and $y_{P1}(s)$ are selected to be the bounding functions of $y_L(s)$, and one sufficient condition for the stability of the gyrator 10 is $w_0=gm/c1$ and $W_0\tau+\angle y_{P1}(jw_0)<\pi/2$, or $\tan(w_0\tau)<(g_1+g_3)/(w_0(c_1+C_3))=c_1(g_1+g_3)/(g_m(c_1+c_3))$, or $\tan(c_m/c_1)<c_1/(A_0(c_1+c_3))$.

In particular, when $r_f=0$, $y_L(s)$ can be simplified as $y_L(s)=(g_1+g_2)+s(c_1+c_2)=g+sc$. Since both $|y_L(s)|$ and $\angle y_L(s)$ are themselves monotonic increasing functions when $w=0\to\infty$, without any additional auxiliary of a bounding function, they can make use of the gain margin (and the phase margin as well) of $F_d(s)$ to be the stable condition of the gyrator 10 directly. For example, when all of the inverters of the gyrator 10 are identical, the necessary and sufficient condition for the stability of the gyrator 10 is $w_0=$ $$\frac{1}{c}\sqrt{(g_m^2-g^2)} = \frac{g_m}{c}\sqrt{\left(1-\frac{1}{A_0^2}\right)}$$

and $w_0\tau + \angle y_L(jw_0) < \pi/2$ or $\tan(w_0\tau) < \frac{g}{\omega_0 c} = \frac{1}{\sqrt{(A_0^2-1)}}$ or $\tan\left(\frac{c_m}{c}\sqrt{1-\frac{1}{A_0^2}}\right) < \frac{1}{\sqrt{(A_0^2-1)}}$.

In particular, $$\sqrt{(A_0^2-1)}\tan\left(\frac{c_m}{c}\sqrt{1-\frac{1}{A_0^2}}\right) < A_0\frac{c_m}{c} = \frac{g_m c_m}{gc}.$$

Therefore, $g_m c_m < gc$ is a sufficient condition for the stability of the gyrator 10.

In contrast to the prior art, the present invention can provide a gyrator comprising a gyrator core and at least a common mode feedback section. The common mode feedback section comprises two reverse series connection inverter sets, each of which comprises an inverter CMI1, an inverter CMI2, and a feedback resistor electrically connected in parallel with the inverter CMI2. Therefore, a DC gain of the gyrator is increased due to the installation of the feedback resistor. Moreover, when the feedback resistor has a resistance equal to zero, the gyrator has a stable condition equal to $$\tan\left(\frac{c_m}{c}\sqrt{1-\frac{1}{A_0^2}}\right) < \frac{1}{\sqrt{(A_0^2-1)}}. \quad (eq.\ 15)$$

In contrast to eq.15, the stable condition g*c is not smaller than gm*cm of the gyrator of the prior art is only a specific sufficient condition.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A gyrator with feedback resistors, the gyrator comprising:
   a gyrator core comprising four inverters mutually connected in a loop configuration between a pair of input ends and a pair of output ends; and
   at least a common mode feedback section electrically connected between the pair of the input ends or the pair of the output ends, the common mode feedback section comprising:
      a forward-reverse series connection inverter set comprising:
         a first inverter;
         a second inverter electrically connected in reverse series with the first inverter; and
         a first feedback resistor electrically connected in parallel with the second inverter; and a backward-reverse series connection inverter set electrically connected in anti-parallel with the forward-reverse series connection inverter set, the backward-reverse series connection inverter set comprising:
a third inverter;
a fourth inverter electrically connected in reverse series with the third inverter; and
a second feedback resistor electrically connected in parallel with the fourth inverter.

2. The gyrator of claim 1, wherein at least one of the four inverters of the gyrator core, the first inverter, the second inverter, the third inverter, or the fourth inverter comprises a transistor.

3. The gyrator of claim 2, wherein the transistor is a MOS transistor.

4. The gyrator of claim 2, wherein the transistor is a CMOS transistor.

5. The gyrator of claim 2, wherein the transistor is a bipolar transistor.

6. The gyrator of claim 2, wherein the transistor is selected to satisfy a stable condition $|y_{LE}^2(jw_0)| > g_m^2$, where $w_0$ is an existing smallest positive number making $2w_0\tau + \angle y_{LE}^2(jw_0) = \pi$, $y_{LE}^2(s)$ is an effective loading product of the gyrator core, $\tau$ is an effective channel delay, and $g_m$ is an effective gyrating constant.

7. The gyrator of claim 2, wherein the four inverters of the gyrator core, the first inverter, the second inverter, the third inverter, and the fourth inverter are all identical, the first feedback resistor has a zero first resistance, the second feedback resistor has a zero second resistance, and the transistor is selected to satisfy a stable condition $$\tan\left(\frac{c_m}{c}\sqrt{1-\frac{1}{A_0^2}}\right) < \frac{1}{\sqrt{(A_0^2-1)}},$$

where $A_0 = g_m/g$ is a DC gain of the gyrator, g is an effective conductive loading of the gyrator core, c is an effective capacitive loading, gm is an effective gyrating constant, and cm is an effective trans-capacitance.

* * * * *